United States Patent
Kaufmann et al.

(10) Patent No.: US 7,795,693 B2
(45) Date of Patent: Sep. 14, 2010

(54) FLAT SUBSTRATE HAVING AN ELECTRICALLY CONDUCTIVE STRUCTURE

(75) Inventors: Heinz Kaufmann, Bad König (DE); Tobias Melz, Darmstadt (DE); Ralf Sindelar, Hannover (DE)

(73) Assignee: Fraunhofer-Gesellschaft zur Forderung der Angewandten Forschung E. V., Munich (DE)

( * ) Notice: Subject to any disclaimer, the term of this patent is extended or adjusted under 35 U.S.C. 154(b) by 144 days.

(21) Appl. No.: 12/083,916

(22) PCT Filed: Oct. 13, 2006

(86) PCT No.: PCT/EP2006/009927

§ 371 (c)(1),
(2), (4) Date: Jun. 30, 2008

(87) PCT Pub. No.: WO2007/045408

PCT Pub. Date: Apr. 26, 2007

(65) Prior Publication Data

US 2008/0315941 A1    Dec. 25, 2008

(30) Foreign Application Priority Data

Oct. 21, 2005    (DE) .................. 10 2005 050 515

(51) Int. Cl.
*H01L 29/00*    (2006.01)
(52) U.S. Cl. .................. 257/417; 257/226; 257/254; 257/414; 257/E27.006
(58) Field of Classification Search .................. 257/417, 257/226, 254, 414, E27.006
See application file for complete search history.

(56) References Cited

U.S. PATENT DOCUMENTS

| 4,226,507 A | 10/1980 | Fuschetto |
| 4,363,991 A | 12/1982 | Edelman |
| 4,868,447 A * | 9/1989 | Lee et al. .................. 310/328 |
| 4,939,021 A | 7/1990 | Aoki |

FOREIGN PATENT DOCUMENTS

| DE | 697 10 939 T2 | 8/2002 |
| DE | 10 2004 058 675 A1 | 6/2006 |
| JP | 7-249847 A | 9/1995 |
| WO | WO 01/73937 | 10/2001 |
| WO | WO 01/84893 A1 | 11/2001 |

OTHER PUBLICATIONS

*International Search Report.

* cited by examiner

*Primary Examiner*—Long K Tran
(74) *Attorney, Agent, or Firm*—Buchanan Ingersoll & Rooney PC

(57) ABSTRACT

The description is of a flat substrate with an electrically conductive structure integrated inside the flat substrate or applied to a surface of the flat substrate and/or with a technically improved surface.

The invention is characterised in that at least one sensor is integrated inside the flat substrate or applied to a surface of the flat substrate, which generates sensor signals according to deformations occurring inside the flat substrate, at least one actuator is integrated inside the flat substrate or applied to the surface of the flat substrate, which enables the flat substrate to mechanically deform when activated, and a signal unit connected to the at least one sensor and to the at least one actuator is provided, which, on the basis of the sensor signals, generates actuator signals for activating the actuator, so that deformations occurring inside the flat substrate are reduced.

7 Claims, 2 Drawing Sheets

FLAT SUBSTRATE HAVING AN ELECTRICALLY CONDUCTIVE STRUCTURE

TECHNICAL FIELD

The invention relates to a flat substrate with an electrically conductive structure, which is integrated inside the flat substrate or applied to a surface of the flat substrate, preferably a printed circuit board or microchip.

STATE OF THE ART

The growing need for electronic equipment with improved functionality is closely linked to advancements in electronic components and makes an essential contribution particularly to miniaturisation and also to improvements in the reliability of devices in this respect. This is also the reason why a great abundance of different varieties of printed circuit boards and microchips have been designed in the field of printed circuit board and microchip technology.

An important aspect in terms of the functionality and reliability of such processed, flat substrates is therefore their dimensional and form stability. Their use results in thermally induced stresses and associated geometric deformation within the flat substrate, particularly under thermally changing ambient conditions, which means that electrical sections of printed circuit boards or microelectronic conductor or processor architectures applied to the flat substrate or integrated therein can be seriously affected. In addition to this, production-related residual stresses can also affect the dimensional accuracy of flat substrates. The important thing here is for steps to be taken to counter such mechanical stresses as effectively as possible. In order to reduce such distortions and warping, additional layers are usually provided on or in the microchip in chip technology, which are largely thermally invariant and should therefore eliminate production and application-related residual stresses.

U.S. Pat. No. 4,939,021 also indicates a multi-layer printed circuit board, which provides copper layers and glass-ceramic layers located between each copper layer to determine the thermal expansion behaviour of the multi-layer printed circuit board.

JP 07 249847 describes a method of producing a multi-layer printed circuit board to be equipped with electronic components that provides a layer of fibre glass material for added stability when the individual layers have different thermal expansion properties, said fibre glass material being compressed with another layer material by means of an epoxy resin to form a laminate.

All known measures for reducing residual stresses and/or thermally induced stresses within processed flat substrates or microchips by providing thermally stable material layers suffer from the disadvantage that the additional layers increase the size of the overall multi-layer system assembly and only guarantee the desired dimensional stability of the carrier substrates to a limited extent, particularly when greater temperature differences occur.

DESCRIPTION OF THE INVENTION

The problem addressed by the invention is that of further developing a flat substrate with an electrically conductive structure integrated within the flat substrate or applied to the surface thereof, preferably a printed circuit board or a microchip, such that production and/or application-related deformations due to mechanical stresses occurring within the flat substrate are largely eliminated. The measures required for this should offer a possible control with which the deformations and warping that occur within the flat substrate can be effectively suppressed, even in cases in which the flat substrate is subject to changes in its own deformation properties.

Aside from the previous use of purely passive layers that attempt to improve the dimensional stability of flat substrates, a flat substrate designed in accordance with the present solution envisages at least one sensor, which is integrated in the flat substrate or applied to the surface of the flat substrate and which generates sensor signals depending on the mechanical stresses occurring within the flat substrate. In addition, at least one actuator is integrated in the flat substrate or applied to the surface thereof and when this is activated when the flat substrate is mechanically deformed, preferably in such a way that the flat substrate retains its original form as far as possible and does not suffer any deformation. Furthermore, the at least one sensor and at least one actuator are connected to a signal unit, which generates actuator signals based on the sensor signals to activate the actuator, so that deformations occurring within the flat substrate can be reduced as far as possible in the manner described earlier.

The system proposed in the solution involves the active influencing of deformation caused within the flat substrate by residual stress or thermal stress. The sensors and actuators based on multifunctional materials, which are preferably applied in layers to a surface of the flat substrate and are preferably made from a piezoceramic, are firstly able to record geometric deformations by sensory means and to leave the flat substrate in a desired, predetermined form through the actuatory initiation of corresponding counter-deformations.

In a particularly preferred exemplary embodiment, sensor layers made from piezoceramic material are applied to the surface of a flat substrate and as a result can detect the smallest flat deformations. The sensor signals generated by the piezoceramic sensor layer are supplied for the further processing of a signal unit likewise applied to the flat substrate or integrated in the flat substrate, in which actuator signals are generated, which are conducted to induce corresponding counter-deformations in the actuator elements which are also formed in layers and made from piezoceramic material.

In the case of a flat element designed as a microchip, internal microchip conductor structures can be used to provide the electrical power supply to the layers with sensory and actuatory action.

The operating reliability of micro-structured flat substrates or else microchips, in which highly integrated electrical circuits are implemented, may be improved according to the invention by means of an active circuit that detects current geometric deformations within the flat substrate and actively suppresses these by initiating corresponding counter-deformations. In this way, the thermally limited application spectrum for flat substrate-bound microsystems can also be significantly expanded, particularly since deformations of thermal origin within the flat substrate can no longer cause the microsystem to fail through active suppression. In addition, production-based deformation caused by residual stresses causes no problem in relation to the desired system reliability and long service life of such flat substrate-bound microsystems.

Apart from the chip technology already mentioned, which gains a significant system advantage as a result of the measure contained in the solution, particularly since the application or integration of layers with sensory and actuatory action on the chip can be undertaken using the microelectronics already provided on the chip to supply electrical power and provide processing power for the evaluation of sensor signals and generation of actuator signals, the advantages associated with the measure in the solution are also available for flat substrates not made with electrical components. For example, flat substrates are technically improved on one side with highly reflective surfaces, which are used individually in microsystem technology dimensions or in an array as micromirrors to direct the light in a particular way. In order to guarantee a high and uniform imaging quality from these micromirrors, the backs of the micromirrors facing away from the mirror surface are provided with at least one sensory and actuatory layer for the active form retention of the micromirrors, irrespective of whether the mirror surfaces are flat or curved.

As has already been mentioned above, piezoceramic materials are particularly suitable for use as sensory and actuatory layers, but other multifunctional materials may also be used, depending on the intended application and flat substrate, such as lead-free piezoceramics, electrostrictive ceramics, shape memory alloys, shape memory polymers, PVDF (polyvinylidene fluoride), magnetostrictive alloys or bi-metals.

BRIEF DESCRIPTION OF THE INVENTION

The invention is described below by way of example, without restricting the general principles underlying the invention and using exemplary embodiments with reference to the drawings. In the figures.

WAYS OF IMPLEMENTING THE INVENTION, COMMERCIAL APPLICABILITY

Figure 1:
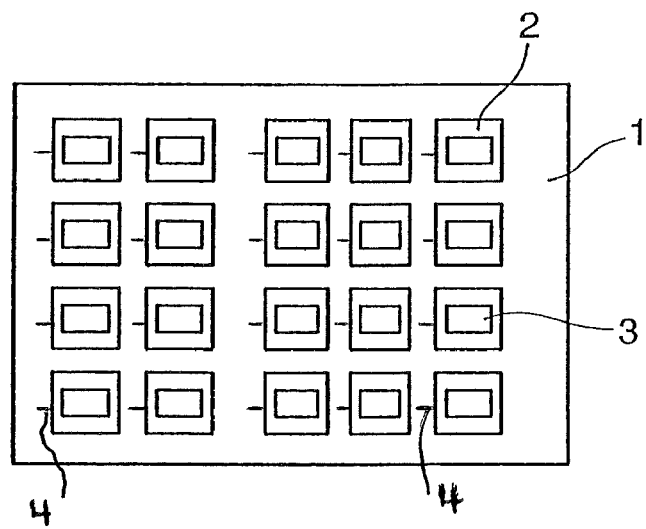
FIG. 1 shows a top view of a surface of the flat substrate.
Figure 2:
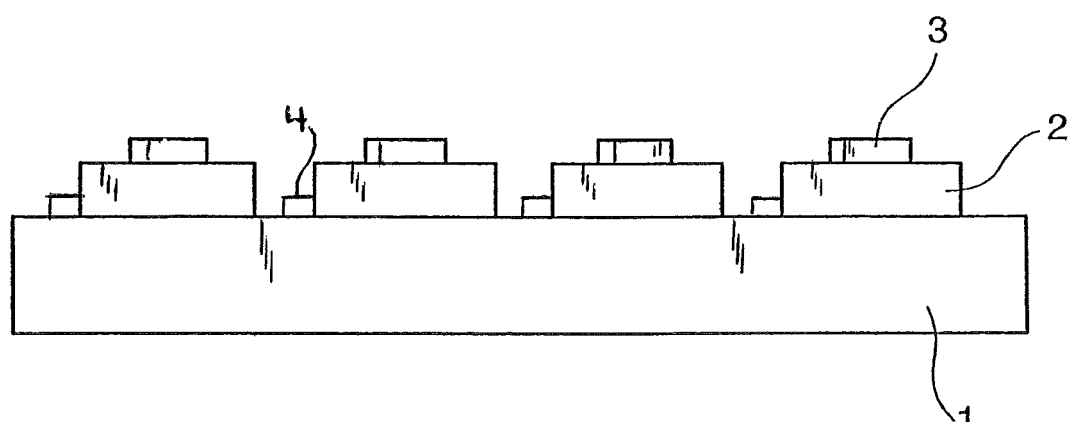
FIG. 2 shows a longitudinal section through a flat substrate with actuatory and sensory layers.

FIG. 1 shows a top view of a level surface of a flat substrate 1 such as a microchip, on which a multiplicity of individual sensor-actuator elements is mounted. FIG. 2 shows a longitudinal section through the flat substrate depicted in FIG. 1. Directly on the surface of the flat substrate 1, piezoelectric ceramic layer deposits are distributed two-dimensionally in a regular configuration and these act as actuator layers 2, on the surface of each of which there is a sensory layer 3 facing away from the flat substrate 1, which is also made from a piezoceramic. The actuator layers 2 are connected to the microchip 1 at 4 supply electrical power to the actuator layers 2. If the flat substrate 1 is deformed due to thermally induced stresses, the sensory layers 3 are also deformed automatically, experiencing a charge displacement due to the piezoelectrical material characteristics and producing a technically ascertainable electrical voltage, which is recorded with the help of a signal evaluation unit not shown in FIG. 1 and on the basis of which corresponding actuating signals are provided for the actuatory layers 2 deposited directly on the flat substrate surface. If an electrical voltage is applied to the actuatory layers 2, then contrary to the working principle of the sensory layer there is a proportional deformation of the actuatory layer 2 that depends on the electrical voltage applied to said actuatory layer 2, which means that the flat substrate 1 is deformed at least in the area of the actuatory layer 2, due to the inner connection between the actuatory layer 2 and the flat substrate 1. The deformation takes place provided there is a reduction in deformation caused by inner stresses within the flat substrate 1, with the object of retaining the form of the flat substrate 1 with as little change as possible.

Figure 2A:
FIG. 2A shows an alternate arrangement, in which the actuatory and sensory layers are integrated inside of the substrate.

Instead of being disposed on a surface of the substrate, actuator layers 2a and sensory layers 3a could be integrated inside of the substrate 1a, as shown in FIG. 2A.

Also, the signal unit could be a part of the chip circuitry (not shown).

The flat substrate in accordance with the exemplary embodiment in FIGS. 1 and 2 is preferably represented by a microchip, which has a multiplicity of individual layers and process structures. Alternatively, it could comprise a semiconductor. It is likewise possible to apply the measure according to the solution to the back of a micromirror system, in order to retain a given mirror shape unchanged, despite changing ambient temperatures.

Figure 3:
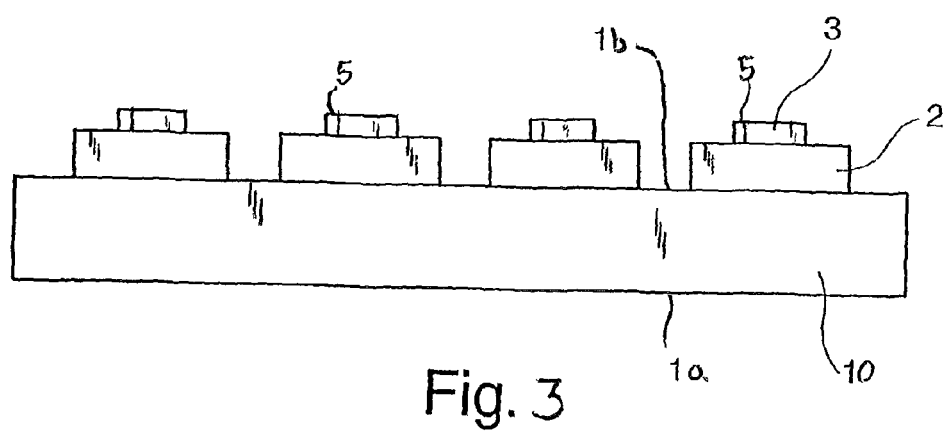
FIG. 3 shows another alternate arrangement in which the substrate is a micromirror.

A micromirror 10 is depicted in FIG. 3, the micromirror including a highly reflective surface 10a and an opposite surface 10b. Actuary layers 2 and sensor layers 3 are disposed on the opposing surface 1b, along with a signal unit 5.

REFERENCE LIST

1 Flat substrate
2 Actuatory layer, actuator
3 Sensory layer, sensor

The invention claimed is:

1. A flat substrate with an electrically conductive structure, which is integrated inside the flat substrate or applied to a surface of the flat substrate and/or with a technically improved surface, in which at least one sensor is integrated inside the flat substrate or applied to a surface of the flat substrate, which generates sensor signals according to mechanical stresses occurring inside the flat substrate, and in which at least one actuator is integrated inside the flat substrate or is applied to the surface of the flat substrate, which enables the flat substrate to mechanically deform when activated, wherein a signal unit connected to the at least one sensor and to the at least one actuator is provided, which, on the basis of the sensor signals, generates actuator signals for activating the actuator, so that deformations occurring inside the flat substrate are reduced,
  wherein the at least one sensor and actuator are formed as respective layers disposed one atop the other and each comprising at least partially of a multifunctional material and
  the flat substrate is a microchip with a single or multilayered construction.

2. The flat substrate according to claim 1,
  wherein the signal unit is part of the chip and the logic system required for signal generation is represented by the chip's intrinsic processing power.

3. The flat substrate according to claim 1,
  wherein the at least one actuator is connected to the chip for electrical power supply.

4. A flat substrate with an electrically conductive structure, which is integrated inside the flat substrate or applied to a surface of the flat substrate and/or with a technically improved surface, in which at least one sensor is integrated inside the flat substrate or applied to a surface of the flat substrate, which generates sensor signals according to mechanical stresses occurring inside the flat substrate, and in which at least one actuator is integrated inside the flat substrate or is applied to the surface of the flat substrate, which enables the flat substrate to mechanically deform when activated, wherein a signal unit connected to the at least one sensor and to the at least one actuator is provided, which, on the basis of the sensor signals, generates actuator signals for activating the actuator, so that deformations occurring inside the flat substrate are reduced, wherein the at least one sensor and actuator are formed as respective layers being joint with the flat substrate two-dimensionally, the respective layers being disposed one atop the other and each comprising at least partially of a multifunctional material, the technically improved surface of the flat substrate has a highly reflective surface and the at least one sensor and actuator are attached to a surface of the flat substrate lying opposite the highly reflective surface.

5. The flat substrate according to claim 4, wherein the signal unit is attached to the surface of the flat substrate lying opposite the highly reflective surface.

6. A flat substrate with an electrically conductive structure, which is integrated inside the flat substrate or applied to a surface of the flat substrate and/or with a technically improved surface, in which at least one sensor is integrated inside the flat substrate or applied to a surface of the flat substrate, which generates sensor signals according to mechanical stresses occurring inside the flat substrate, and in which at least one actuator is integrated inside the flat substrate or is applied to the surface of the flat substrate, which enables the flat substrate to mechanically deform when activated, wherein a signal unit connected to the at least one sensor and to the at least one actuator is provided, which, on the basis of the sensor signals, generates actuator signals for activating the actuator, so that deformations occurring inside the flat substrate are reduced, wherein the flat substrate is a semiconductor substrate with a surface on which at least one locally limited first layer of multifunctional material is deposited, and that a second layer of the same or a different multifunctional material is deposited atop the first layer, one of the first and second layers comprising a sensor and the other of the first and second layers comprising an actuator.

7. The flat substrate according to claim 6, wherein the multifunctional material is a material falling into one of the following categories:

piezoceramics, lead-free piezoceramics, electrostrictive ceramics, shape memory alloys, shape memory polymers, PVDF (polyvinylidene fluoride), magnetostrictive alloys or bi-metals.

\* \* \* \* \*